United States Patent [19]
Shibuya

[11] Patent Number: 5,624,861
[45] Date of Patent: Apr. 29, 1997

[54] METHOD OF MANUFACTURING SEMICONDUCTOR DEVICE

[75] Inventor: Tsukasa Shibuya, Tenri, Japan

[73] Assignee: Sharp Kabushiki Kaisha, Osaka, Japan

[21] Appl. No.: 681,512

[22] Filed: Jul. 23, 1996

[30] Foreign Application Priority Data

Aug. 28, 1995 [JP] Japan .................... 7-219023

[51] Int. Cl.$^6$ .................. H01L 21/86; H01L 21/786
[52] U.S. Cl. .................. 438/164; 438/30; 438/911
[58] Field of Search .............. 437/40 TFT, 41 TFT, 437/913, 235, 236, 233, 40 TOI, 41 TFI; 148/DIG. 150, DIG. 102, DIG. 106, DIG. 1

[56] References Cited

U.S. PATENT DOCUMENTS

| | | | |
|---|---|---|---|
| 4,502,204 | 3/1985 | Togashi et al. | 437/233 |
| 4,684,435 | 8/1987 | Kishi et al. | 437/245 |
| 4,984,033 | 1/1991 | Ishizu et al. | 257/98 |
| 5,028,122 | 7/1991 | Hamada et al. | 359/59 |
| 5,066,110 | 11/1991 | Mizushima et al. | 359/54 |
| 5,079,178 | 1/1992 | Chouan et al. | 437/40 TFT |
| 5,352,907 | 10/1994 | Matsuda et al. | 257/59 |
| 5,439,837 | 8/1995 | Hata et al. | 437/41 TFT |

FOREIGN PATENT DOCUMENTS

| | | | |
|---|---|---|---|
| 2272430 | 11/1990 | Japan | 437/41 TFT |
| 6034997 | 2/1994 | Japan . | |

Primary Examiner—Michael Trinh

[57] ABSTRACT

A manufacturing method of a semiconductor device includes the steps of depositing a metallic film (light-shielding film), an insulating film and a semiconductor film in this order on an insulating substrate, and after patterning the insulating film and the semiconductor film in a predetermined shape, oxidizing an exposed region of the metallic film using the insulating film and the semiconductor film as a mask. As a result, the light-shielding film composed of the metallic film is formed so as to cover the semiconductor film to block light from an external portion. The manufacturing method permits a process of forming a resist pattern for use in forming the light-shielding film and a process of etching the light-shielding film to be omitted, thereby reducing the required number of processes. Moreover, as a level difference is not generated around the light-shielding film, a generation of a level difference on the semiconductor film can be prevented. Furthermore, as the light-shielding film can be formed completely overlapped with the semiconductor film, a reduction in a display region of the semiconductor device can be avoided, thereby improving an aperture ratio.

20 Claims, 6 Drawing Sheets

1

METHOD OF MANUFACTURING SEMICONDUCTOR DEVICE

FIELD OF THE INVENTION

The present invention relates to a method of manufacturing a semiconductor device provided with a thin film transistor formed on an insulating substrate such as glass, etc., used in an active region, more particularly relates to a method of manufacturing a semiconductor device that is suitably adopted especially in an active-matrix type image display device, an image sensor, etc.

BACKGROUND OF THE INVENTION

There are known semiconductor devices with a thin film transistor (hereinafter referred to as TFT) formed on an insulating substrate made of glass, etc., such as an active-matrix type liquid crystal display device wherein a TFT is used as a switching element, an image sensor, etc.

In the TFT adopted in the described devices, generally, an amorphous silicon film, or a polysilicon film having crystallinity is used as a semiconductor film made of a thin-film shaped silicon. The TFT adopting the described silicon film, however, has the problem of changes in characteristics such as an increase in OFF-state current, a change in threshold voltage, etc., when a light beam is incident on a semiconductor film, which would result in lower reliability of the TFT.

To eliminate the described problem, a technique of forming a light-shielding film in a channel region has been adopted. As shown in FIG. 3(a) and FIG. 3(b), a conventional TFT having the light-shielding film in a channel region includes an insulating substrate 1, a light-shielding film 2, an insulating film 3, a semiconductor film 4, a gate insulating film 6, a gate electrode 7, an interlayer insulating film 8, a contact hall 9, a source electrode 10 and a drain electrode 11.

The conventional process of manufacturing the TFT wherein the light-shielding film is formed in the channel region will be explained in reference to FIG. 4(a) through FIG. 4(d).

First, a metallic film 2 of metal such as Ta, etc., is formed with a thickness of 100 nm as a light-shielding film on the insulating substrate 1 of glass, etc. Thereafter, a photoresist is deposited thereon, and the photoresist is patterned to form a photoresist 12a in a predetermined shape so as to entirely cover at least the channel region.

Next, an etching of the metallic film 2 is performed using the patterned photoresist 12a as a mask. After completing the etching process, the photoresist 12a is removed. As a result, the metallic film 2 is patterned into a predetermined shape so as to entirely cover the channel region. Thereafter, the insulating film 3, and the semiconductor film 4 wherein the channel region, the drain region and the source region are formed are deposited in this order on the entire surface of the insulating substrate 1 and the metallic film 2.

Further, a photoresist is deposited on the semiconductor film 4, and the photoresist 12b is patterned into a predetermined shape as shown in FIG. 4(b). Next, as shown in FIG. 4(c), the semiconductor film 4 is patterned into a predetermined shape using the photoresist 12b as a mask, and thereafter, the photoreceptor 12b is removed.

Then, as shown in FIG. 4(d), the gate insulating film 6 and the gate electrode 7 are formed, and the interlayer insulating film 8 is formed. Further, a contact hall 9, a source electrode 10 and a drain electrode 11 are formed.

However, the described conventional method of forming the light-shielding film requires significantly increased number of processes including the process of forming a resist pattern, an etching process of the light-shielding film, etc., compared with the case where the light-shielding film is not formed.

Besides, the characteristics of the TFT are determined by a current flowing in the channel region. Therefore, in order to prevent irregularities in characteristics of the TFT, it is required to prevent at least the channel region from having a light beam incident thereon. Therefore, it is necessary to form the light-shielding film so as to cover at least the channel region. However, the conventional method does not provide a solution to solve the problem of positioning error occurred when forming the resist pattern, thereby failing to form the light-shielding film on a position as designed with accuracy.

In consideration of the described positioning error, it is required that the light-shielding film be designed to be larger than the channel region of the semiconductor film. Therefore, as shown in FIG. 3(b), the light-shielding film has a larger TFT portion for the area protruded from the channel region, and an aperture ratio representing a ratio of area subject to display would be lowered.

Namely, the aperture ratio indicates a ratio of the display region in each pixel, i.e., a ratio of a region which is not shielded by the TFT portion to the whole pixel size, and the greater is the size of the TFT portion which is used as a switching element in each pixel, the more reduced is the display region, thereby lowering the aperture ratio.

Besides, according to the described conventional method, as a difference in level arises on the surface of the semiconductor film, such problem that the semiconductor film is disconnected at a portion where the difference in level is formed occurs.

SUMMARY OF THE INVENTION

An object of the present invention is to provide a method of manufacturing a semiconductor device which enables a light-shielding film to be formed in a reduced number of processes without generating a level difference on a semiconductor film due to the formation of the light-shielding film while improving an aperture ratio.

To fulfill the above-mentioned object, the first method of manufacturing a semiconductor device in accordance with the present invention which is provided with a thin film transistor including a light-shielding film composed of a metallic film formed on an insulating substrate and a semiconductor film formed on the light-shielding film via an insulating film, and a pixel electrode connected to the thin film transistor, is characterized by including the steps of:

depositing the metallic film, the insulating film and the semiconductor film in this order on the insulating substrate;

patterning the insulating film and the semiconductor film thus deposited into a predetermined shape; and forming a metallic oxide film by oxidizing an exposed region of the metallic film using the patterned insulating film and the semiconductor film as a mask.

According to the described first method, the process of patterning the light-shielding film can be omitted, thereby preventing a significant increase in the number of required processes. Additionally, as the light-shielding film is formed by selectively oxidizing a specific region of the metallic film, a generation of a level difference on the surface of the semiconductor film can be prevented, thereby preventing the problems associated with a level difference on the surface of the semiconductor film.

Furthermore, as the light-shielding film is formed by oxidizing the exposed region of the metallic film using the semiconductor film and the insulating film as a mask, the light-shielding film can be formed on the semiconductor film by the self-alignment method. As a result, as the light-shielding film can be formed in the same region as the semiconductor film, the region protruded to the conventional TFT can be utilized for the display purpose, thereby improving the aperture ratio.

Therefore, when applying the manufacturing method of the present invention to the insulating substrate, for example, a glass substrate of 300 mm×300 mm, the TFT of high performance can be economically manufactured. As a result, the described first method of the present invention permits an active-matrix image display device provided with the TFT as a pixel switching element or a peripheral driving circuit to be manufactured with high reliability and at high aperture ratio.

In order to fulfill the aforementioned object, the second method of manufacturing a semiconductor device which is provided with a thin film transistor including a light-shielding film composed of a metallic film formed on an insulating substrate and a semiconductor film formed on the light-shielding film via an insulating film, and a pixel electrode connected to the thin film transistor, is characterized by including the steps of:

depositing the metallic film on the insulating substrate;

forming a metallic oxide film by oxidizing a surface layer of the metallic film only to a predetermined thickness;

depositing the semiconductor film on said metallic oxide film formed by the oxidizing process;

patterning the metallic oxide film and the semiconductor film into a predetermined shape; and forming a metallic oxide film by oxidizing an exposed region of the metallic film using the patterned metallic oxide film and the semiconductor film as a mask.

The described second method of manufacturing a semiconductor device offers the following effects in addition to the effects achieved by the first method. That is, the light-shielding film and the insulating film can be manufactured using a material of one kind, thereby economically manufacturing a material of the light-shielding film as the cost required for the raw material thereof can be reduced, while simplifying the manufacturing process.

The novel features which are considered as characteristic of the invention are set forth in particular in the appended claims. The improved treatment method, as well as the construction and mode of operation of the improved treatment apparatus, will, however, be best understood upon perusal of the following detailed description of certain specific embodiments when read in conjunction with the accompanying drawings.

DESCRIPTION OF THE EMBODIMENTS

The following descriptions will discuss one embodiment of the present invention in reference to FIG. 1(a) through FIG. 1(d) and FIG. 5 and FIG. 6.

Figure 1:
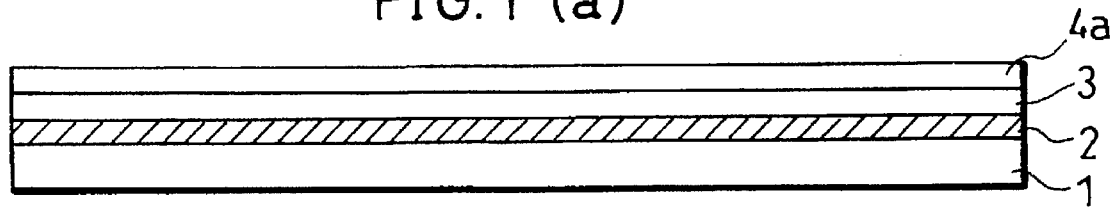
FIG. 1(a) is a cross-sectional view of a TFT section in one process of a manufacturing method of a semiconductor device in accordance with one embodiment of the present invention.
FIG. 1(b) is a cross-sectional view of the TFT section in another process of the manufacturing method.
FIG. 1(c) is a cross-sectional view of the TFT section in still another process of the manufacturing method.
FIG. 1(d) is a cross-sectional view of the TFT section of the semiconductor device manufactured by the manufacturing method.
Figure 1:
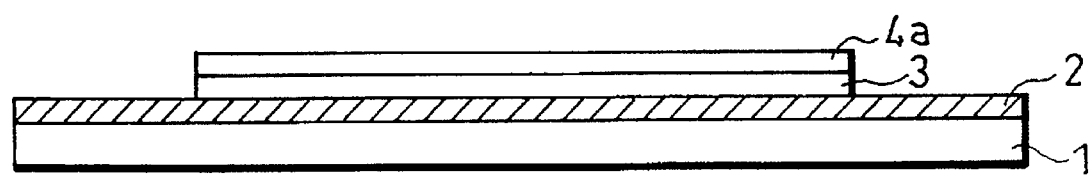
Figure 1:
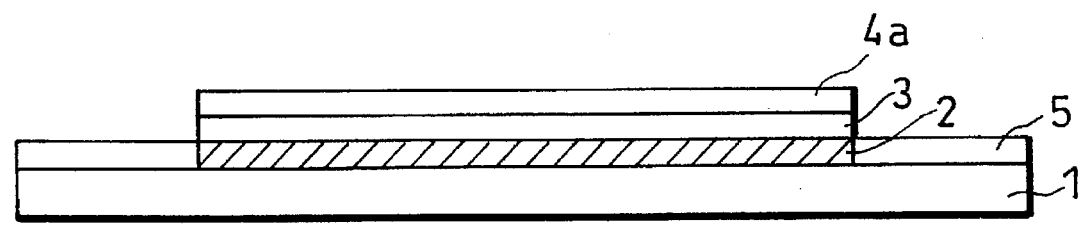
Figure 1:
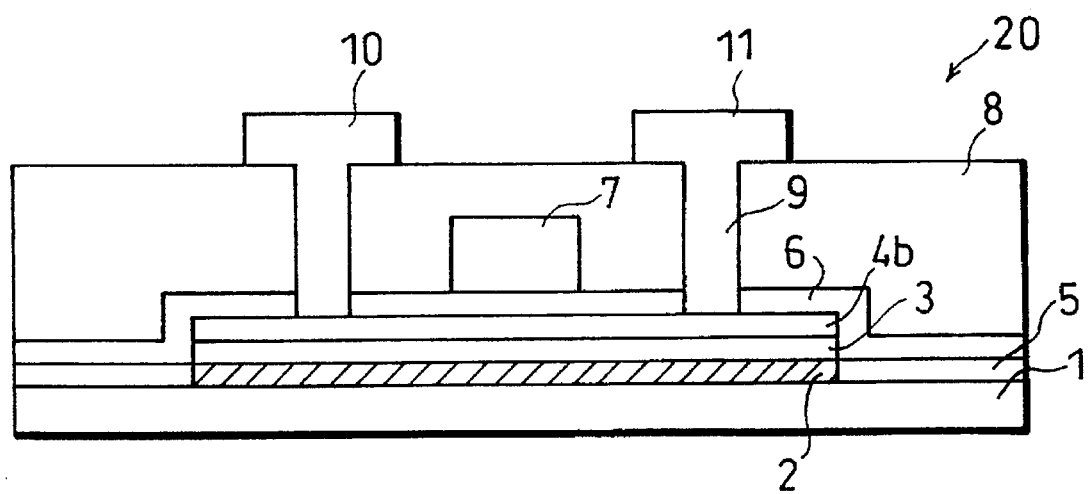

First, the process of manufacturing a TFT 20 shown in FIG. 1(d) will be explained.

First, the surface of an insulating substrate 1 made of an insulating plate having a property that light is transmissible therethrough, such as glass substrate, etc., of around 300 mm×300 mm is washed. Thereafter, a metallic film 2 which serves as a light-shielding film is deposited thereon so as to have a thickness of around 100 nm using the sputtering method. The metal for use in the metallic film 2 is not particularly limited and can be selected among those which show excellent resistance to heat for the subsequent high temperature treatment and those show such a property that light is transmissible therethrough when oxidized. However, it is preferable that the metallic film 2 is a high melting-point metallic film made of at least one element selected from the group consisting of Ta, Ti, Mo and W.

Here, the subsequent high temperature treatment suggests a process of crystallizing an amorphous silicon film 4 (to be described later) and a process of activating impurities injected in a source-drain region. Specifically, in the process of crystallizing an amorphous silicon film 4a, a melt recrystallization is performed over some tens hours at 600° C. or above. In the process of activating the impurities, an annealing process is performed over some hours, or a laser beam is projected to activate the impurities. Here, it is not preferable to adopt a metal of low melting point, as such metal may be melted in the described processes of the high temperature treatment, which causes a process inferior such as peeling, etc.

In the case of adopting a top-gate type TFT, generally, a desirable contact with source and drain electrodes is achieved by lowering a resistance of polysilicon by injecting impurities such as phosphorus or boron, etc., in the source-drain region.

Next, on the metallic film 2, the insulating film 3 made of an insulating member which has a property that light is transmissible therethrough such as a silicon oxide ($SiO_2$) film or a silicon nitride ($SiN_x$) film is deposited by a CVD (Chemical Vapor Deposition) method or a sputtering method so as to have a thickness in a range of 50–100 nm. Thereafter, as shown in FIG. 1(a), the amorphous silicon film 4a is laminated as a semiconductor film so as to cover the entire surface of the insulating film 3 with a thickness of 10–50 nm.

Then, after forming the photoresist (not shown) on the amorphous silicon film 4a, the photoresist is patterned into a predetermined shape using a photolithographic technique. Then, etching of the amorphous silicon film 4a and the insulating film 3 is performed continuously and selectively so as to lately form the polysilicon film 4b, as shown in FIG. 1(d), using the patterned photoresist as a mask. Thereafter, the photoresist is removed. As a result, in a portion where the amorphous silicon film 4a and the insulating film 3 are etched, the metallic film 2 is exposed as shown in FIG. 1(b).

As the method of selectively etching the amorphous silicon film 4a and the insulating film 3, a dry etching method is preferable. The dry etching is performed in an atmosphere of fluorine gas such as $CF_4$, etc., or a mixed gas atmosphere of fluorine and oxygen, etc. Here, although it is possible to perform a wet etching using a fluorine reagent, the wet etching method is not preferable as it results in low ratio in selectivity of the polysilicon film 4b to the insulating substrate 1, a low ratio in selectivity of the polysilicon film 4b to the insulating film 3 and a low resistance to the photoresist.

Next, the metallic film 2 is oxidized either by the annealing oxidization method to be performed over several hours in an atmosphere of oxygen or the anodic oxidization method. As a result, as shown in FIG. 1(c), only the portion exposed to the metallic film 2 is selectively oxidized, thereby forming the insulating metallic oxide film 5 having a property that light is transmissible therethrough. As a result, the light-shielding film of the metallic film 2 is formed on the side of the insulating substrate 1 of the amorphous silicon film 4a by the self-alignment method.

The oxidization conditions for the anneal oxidization method for the metallic film 2 cannot be generalized as they differ depending on the kind, purity, etc., of the metal used in the metallic film 2. However, for example, in the case of adopting the metallic film 2a made of Ta, the annealing process is to be performed over several hours at above 500° C. (for example, 550° C.) in an atmosphere of 100% oxygen. Similarly, the annealing time cannot be generalized as it differs depending on the kind of metal, the thickness of the metallic film, etc. However, in the case of adopting the metallic film 2 made of Ta with a thickness of 100 nm, the annealing should be performed over 5–6 hours at 500° C. There is an upper limit for the annealing temperature in consideration of the distortion of the insulating substrate, etc., and the annealing is generally performed at temperature of not more than around 600° C. On the other hand, in the case of adopting the anodic oxidization method, for example, an electrolyte such as 1–3 percent solution of ammonium tartrate may be used.

After the metallic film 2 is oxidized, the TFT is manufactured using a known technique disclosed in U.S. Pat. No. 5,439,837 or U.S. patent application Ser. No. 08/357,648. Specifically, the amorphous silicon film 4a is crystallized by a melting recrystallization technique over 20 hours or more at 600° C. to form the polysilicon film 4b, the gate insulating film 6 and the gate electrode 7, and the interlayer insulating film 8 is formed. Thereafter, the contact hall 9, the source electrode 10 and the drain electrode 11 are formed, thereby manufacturing the TFT 20 shown in FIG. 1(d).

Figure 5:
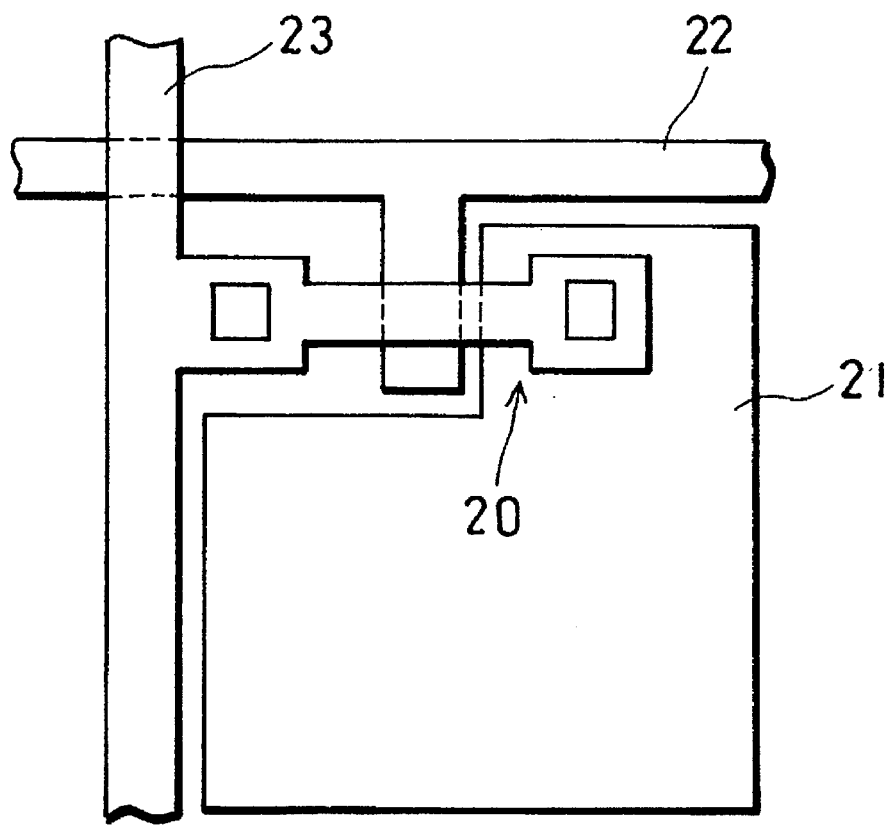
FIG. 5 is a plan view showing a schematic configuration of a semiconductor device in accordance with one embodiment of the present invention.

Then, the semiconductor device is manufactured using the TFT 20, for example, by the method disclosed in U.S. Pat. Nos. 5,028,122 and 5,066,110. As shown in FIG. 5, the semiconductor device manufactured using the TFT 20 includes the TFT 20 which serves as a switching element of each pixel, the pixel electrode 21 connected to the drain electrode 11 of the TFT 20, the gate line 22 integrally formed with the gate electrode 7 of the TFT 20, and the source line 23 which crosses the gate line 22 at right angle, and is integrally formed with the source electrode 10 of the TFT 20. FIG. 5 is a diagram showing a portion corresponding to a pixel of the semiconductor device. Although not shown, a light source is formed on the side of the insulating substrate of the TFT 20.

As described, according to the manufacturing method of the present invention, the light-shielding film can be formed in one step of oxidizing the metallic film 2 using the amorphous silicon film 4 and the insulating film 3 as a mask, and the process of patterning the metallic film 2 can be eliminated. Therefore, the method of the present invention permits four processes of removing a photoresist, patterning the photoresist, etching the metallic film and forming the photoresist from the conventional method which requires the metallic film 2 to be patterned.

Figure 6:
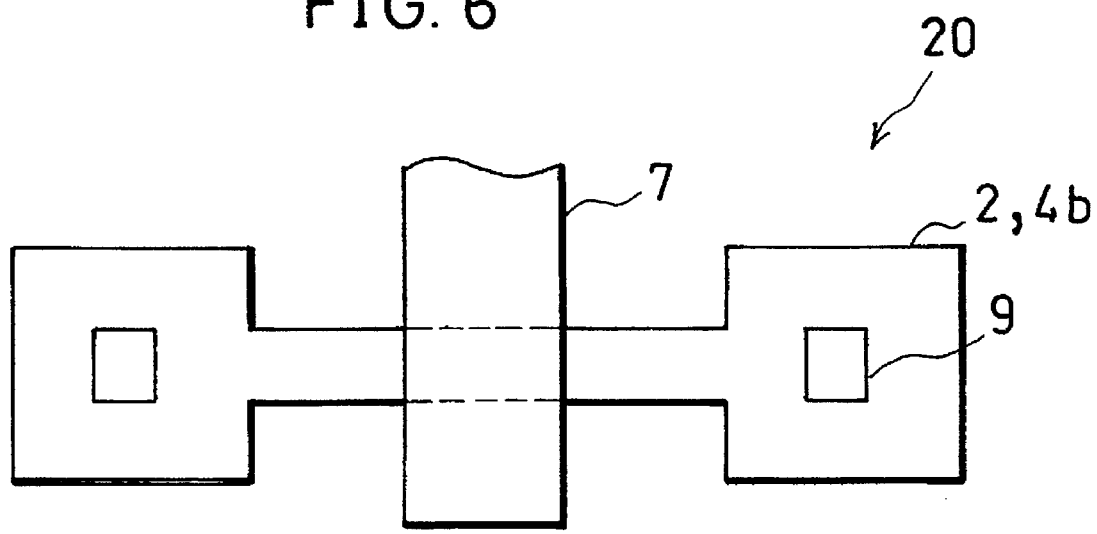
FIG. 6 is a plan view showing a schematic configuration of the TFT section of the semiconductor device shown in FIG. 1(d).

As shown in FIG. 6, the TFT 20 of the semiconductor device is arranged such that the light-shielding film made of the metallic film 2 and the polysilicon film 4b are completely overlapped. Therefore, light perpendicularly incident on the polysilicon film 4b from the side of the insulating substrate 1 can be surely cut off by the light-shielding film. Additionally, a dispersed light or a stray light may be incident on the polysilicon film 4b; however, this would not be a problem as most of them do not greatly affect the characteristics of the TFT.

The display region of each pixel of the liquid crystal display device is outside the light-shielding region of the TFT 20 in the pixel electrode 21. However, the region in which light is cut off by the light-shielding film composed of the metallic film 2 would not come outside the region in which light is cut off by the polysilicon film 4b. Therefore, a reduction in the display region caused by forming the light-shielding film so as to cover the polysilicon film 4b can be prevented, thereby improving the aperture ratio.

Moreover, as the light-shielding film and the metallic oxide film 5 are formed by oxidizing an exposed region of the metallic film 2, a level difference is not generated on the polysilicon film 4b, thereby preventing the problems associated with a level difference formed on the polysilicon film 4b.

SECOND EMBODIMENT

Another embodiment of the present invention will be explained in reference to FIG. 2(a) through FIG. 2(d) and FIG. 7.

The process of manufacturing a TFT 30 shown in FIG. 2(d) will be explained.

First, the surface of an insulating substrate 1 such as a glass substrate of around 300 mm×300 mm is washed. Thereafter, a metallic film 2 is deposited as a light-shielding film to the thickness of around 200 nm by the sputtering method. For the metallic film 2, a high melting-point metallic film of at least one element selected from the group consisting of Ta, Ti, Mo and W is preferable as in the case of the first embodiment.

Next, a metallic oxide film 5 which serves as an insulating film is formed by oxidizing the surface of the metallic film 2 to a thickness of 100 nm using the anneal oxidization method in an atmosphere of oxygen, or the anodic oxidization method. The described oxidization is performed in the same manner as the method of forming the metallic oxide film 5 in the first embodiment. The thickness of the metallic oxide film 5 is controlled by adjusting the temperature or time of oxidation in the annealing method, while by adjusting an application voltage in the anodic oxidization method.

Figure 2:
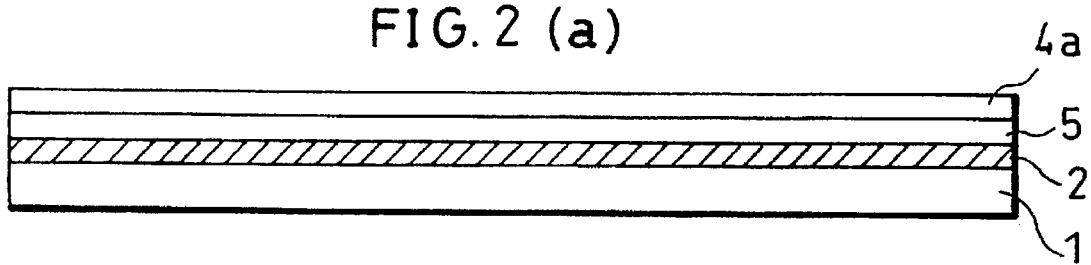
FIG. 2(a) is a cross-sectional view of a TFT section in one process of a manufacturing method of a semiconductor device in accordance with another embodiment of the present invention.
FIG. 2(b) is a cross-sectional view of the TFT section in another process of the manufacturing method.
FIG. 2(c) is a cross-sectional view of the TFT section in still another process of the manufacturing method.
FIG. 2(d) is a cross-sectional view of the TFT section of the semiconductor device manufactured by the manufacturing method.
Figure 2:
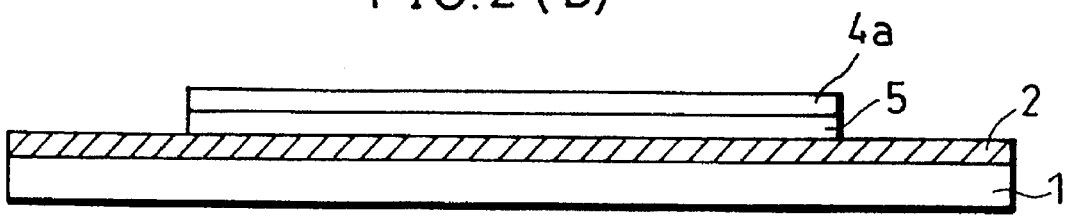
Figure 2:
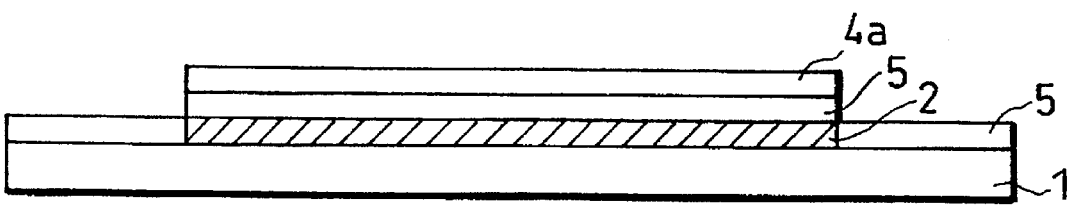
Figure 2:
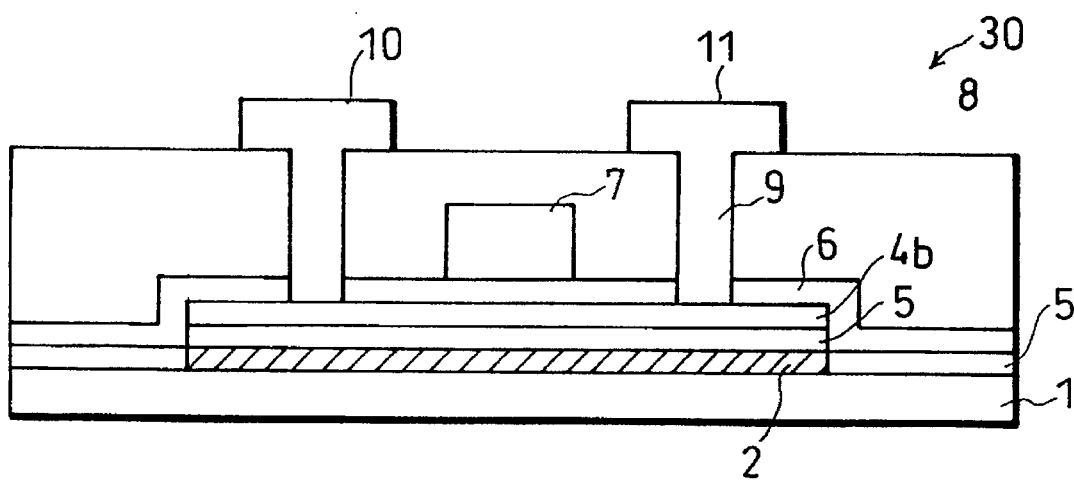
Figure 3A:
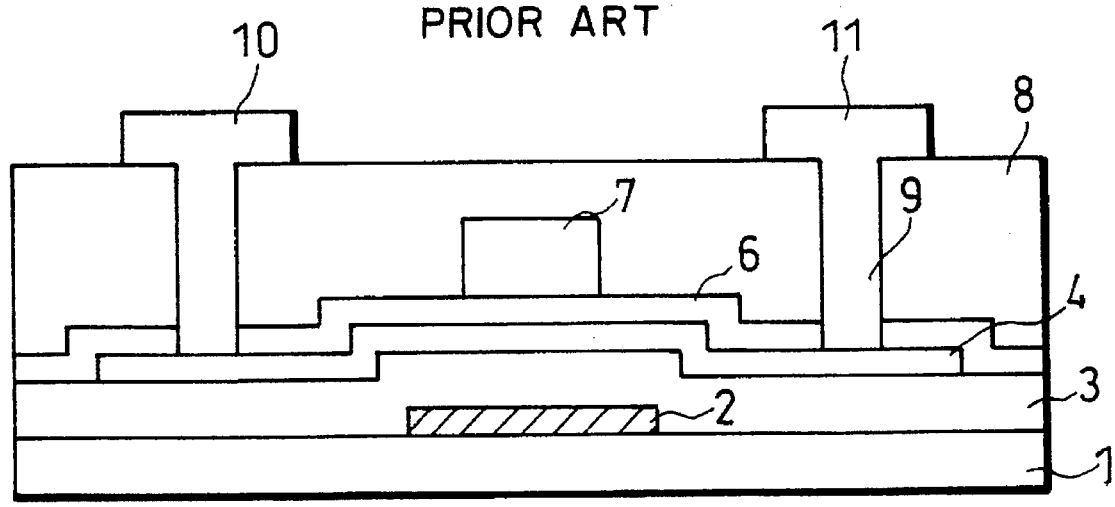
FIG. 3(a) is a cross-sectional view of the TFT section of the semiconductor device manufactured by the conventional method, wherein the light-shielding film is formed in a channel region.
Figure 3B:
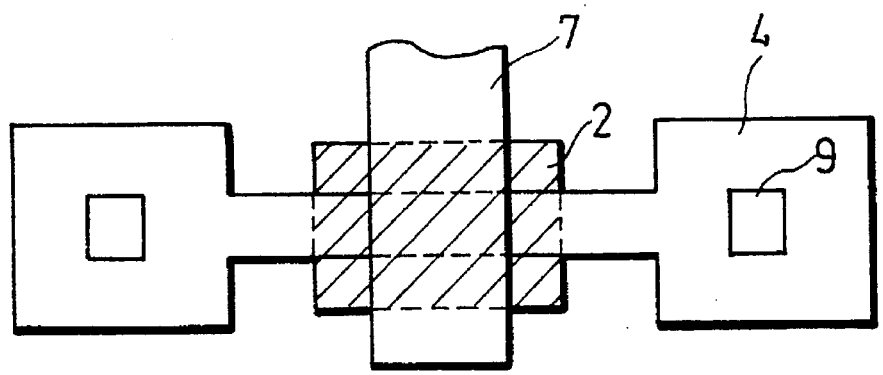
FIG. 3(b) is a plan view showing a schematic configuration of the TFT section.
Figure 4A:
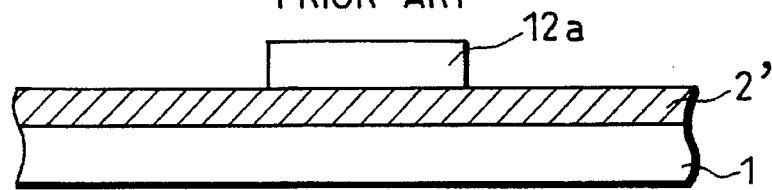
FIG. 4(a) is a cross-sectional view of a TFT section in one process of a conventional manufacturing method.
Figure 4B:
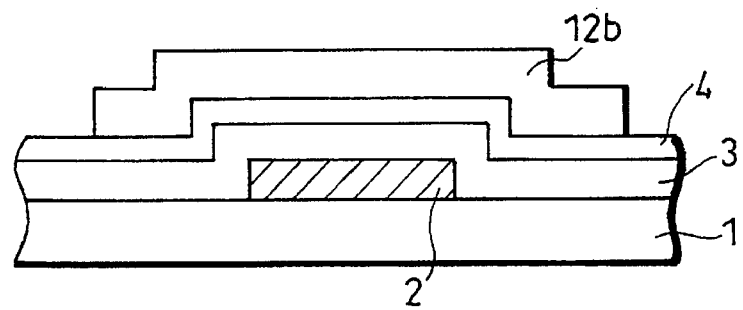
FIG. 4(b) is a cross-sectional view of the TFT section in another process of the conventional manufacturing method.
Figure 4C:
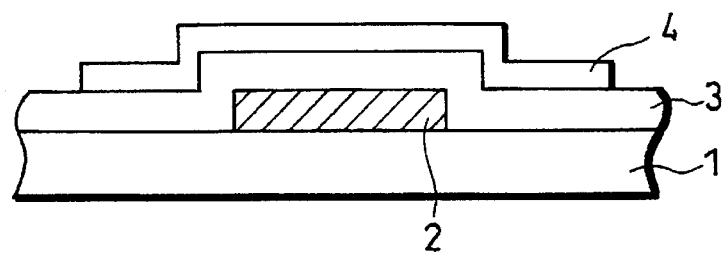
FIG. 4(c) is a cross-sectional view of the TFT section in still another process of the conventional manufacturing method.
Figure 4D:
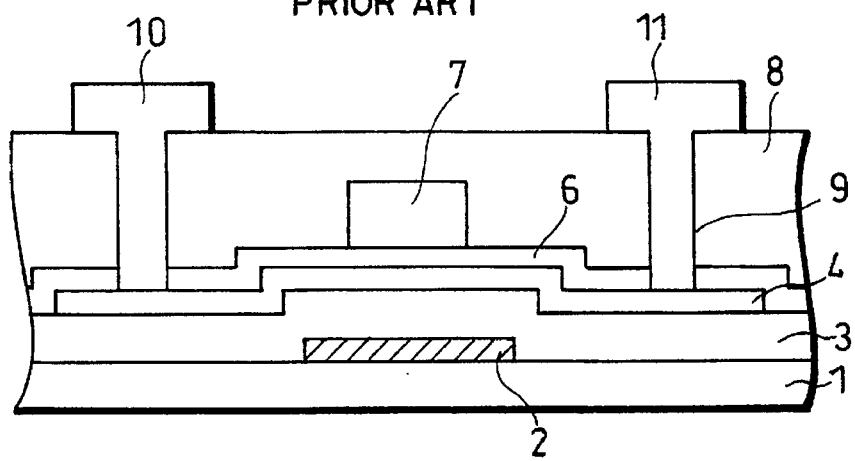
FIG. 4(d) is a cross-sectional view of the TFT section of the semiconductor device manufactured by the conventional method.

As shown in FIG. 2(a), using the CVD method, an amorphous silicon film 4a is deposited as the semiconductor film on the entire surface of the metallic oxide film 5 to a thickness of 10–50 nm.

Next, a photoresist (not shown) is deposited on the amorphous silicon film 4a, and subsequently, using a photolithographic technique, the photoresist is patterned in a predetermined shape. Thereafter, using the patterned photoresist as a mask, the amorphous silicon film 4a and the metallic oxide film 5 are etched successively and selectively to form the polysilicon film 4b, and the photoresist is removed. As a result, in the portion where the amorphous silicon film 4a and the metallic oxide film 5 are etched, the metallic film 2 is exposed as shown in FIG. 2(b). The etching of the amorphous silicon film 4a and the metallic oxide film 5 is performed in the same manner as the first embodiment.

Using the amorphous silicon film 4a and the metallic oxide film 5 as a mask, the oxidization of the metallic film 2 is performed by the annealing method for annealing over several hours in an atmosphere of oxygen or by the anodic oxidization method. As a result, as shown in FIG. 2(c), only the exposed portion of the metallic film 2 is selectively oxidized to form a metallic oxide film 5. The described oxidization can be performed in the same manner as that adopted in forming the metallic oxide film 5 in the first embodiment. As a result, the light-shielding film of the metallic film 2 is formed by the self-alignment method with respect to the amorphous silicon film 4a on the side of the insulating substrate 1 of the amorphous silicon film 4a.

After the oxidization of the metallic film 2 is performed, the TFT 30 is manufactured in the same manner as the first embodiment. That is, the amorphous silicon film 4a is crystallized using a melting recrystallization technique over 20 hours or more to form the polysilicon film 4b. Further, a gate insulating film 6 and a gate electrode 7 are formed thereon and a interlayer insulating film 8 is formed. Further, a contact hall 9, a source electrode 10 and a drain electrode 11 are formed, thereby manufacturing the TFT 30 shown in FIG. 2(d).

Figure 7:
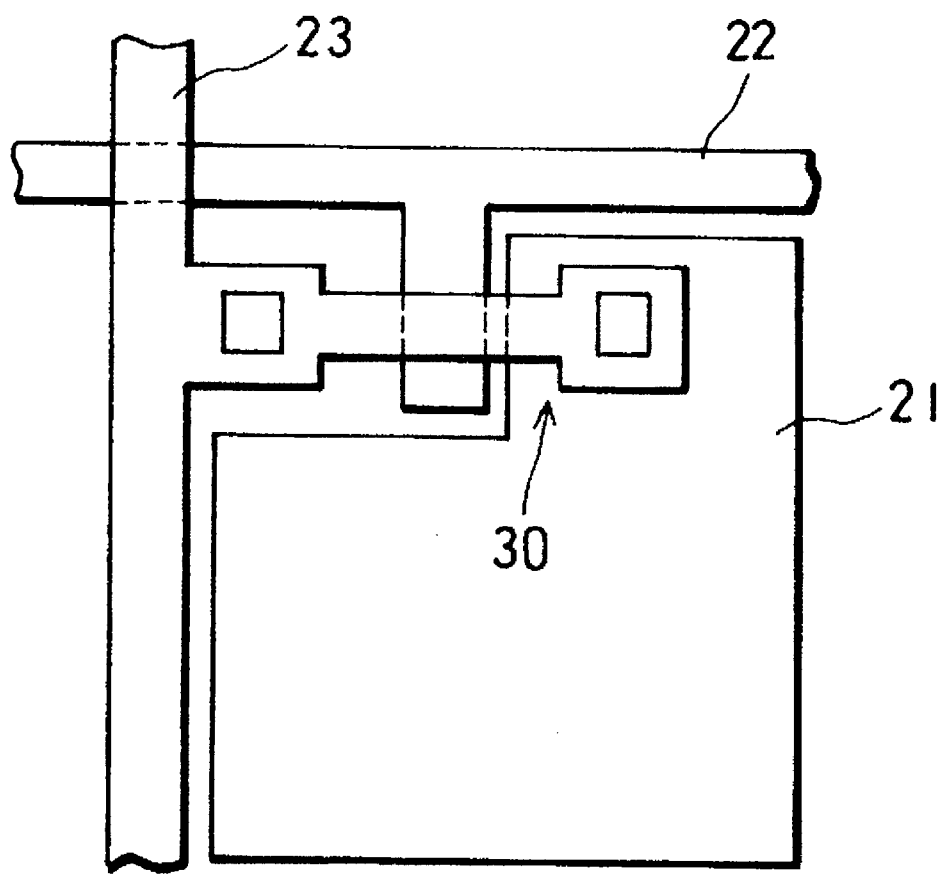
FIG. 7 is a plan view showing a schematic configuration of a semiconductor device in accordance with another embodiment of the present invention.

Then, using the TFT 30, the semiconductor device shown in FIG. 7 can be manufactured in the same manner as the first embodiment. Other than the TFT 30, the semiconductor device of the present invention is the same as that of the aforementioned embodiment, and thus the descriptions thereof shall be omitted here.

The manufacturing method in accordance with the described second embodiment is modified from the method of the first embodiment by adopting a different method for forming the insulating film. Therefore, the manufacturing method of the second embodiment offers the effects of reducing the process of forming the light-shielding film, and improving the aperture ratio while surely cutting-off a light beam incident on the polysilicon film 4b, thereby providing a solution to problems associated with a level difference formed on the surface of the polysilicon film 4b.

Furthermore, according to the manufacturing method of the second embodiment, the insulating film composed of the metallic oxide film 5 is formed by oxidizing the surface layer of the metallic film 2 formed on the insulating substrate 1, and this feature permits the light-shielding film and the insulating film to be formed using a material of one kind, thereby economically manufacturing the light-shielding film as the cost for raw material thereof can be reduced, while simplifying the manufacturing process.

In the described preferred embodiments, by crystallizing the amorphous silicon 4a, the polysilicon film 4b which serves as the semiconductor film is formed. However, the method of the present invention is not limited to this, and, for example, the process of depositing the amorphous silicon film 4a may be replaced by the process of depositing the polysilicon film 4b using the direct CVD method.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of the instant contribution to the art and, therefore, such adaptations should and are intended to be comprehended within the meaning and range of equivalence of the appended claims.

What is claimed is:

1. A method of manufacturing a semiconductor device provided with a thin film transistor including a light-shielding film composed of a metallic film formed on an insulating substrate and a semiconductor film formed on the light-shielding film via an insulating film, and a pixel electrode connected to said thin film transistor, comprising the steps of:

depositing said metallic film, said insulating film and said semiconductor film in this order on said insulating substrate;

patterning said insulating film and said semiconductor film thus deposited into a predetermined shape; and forming a metallic oxide film by oxidizing an exposed region of said metallic film using the patterned insulating film and the semiconductor film as a mask.

2. The method of manufacturing a semiconductor device as set forth in claim 1, wherein:

said metallic film is made of at least one high melting-point metal selected from the group consisting of Ta, Ti, Mo and W.

3. The method of manufacturing a semiconductor device as set forth in claim 1, wherein:

said metallic film is composed of a metal which shows such a property that light is transmissible therethrough when oxidized.

4. The method of manufacturing a semiconductor device as set forth in claim 1, wherein:

said metallic film is composed of a metal which shows an insulating property when oxidized.

5. The method of manufacturing a semiconductor device as set forth in claim 1, wherein:

said step of patterning said semiconductor film and said insulating film is performed by a dry etching method.

6. The method of manufacturing a semiconductor device as set forth in claim 1, wherein:

said process of oxidizing the exposed region of said metallic film is performed by an anodic oxidization method.

7. The method of manufacturing a semiconductor device as set forth in claim 1, wherein:

said process of oxidizing the exposed region of said metallic film is performed by an annealing method in an atmosphere of oxygen.

8. The method of manufacturing a semiconductor device as set forth in claim 1, wherein:

said deposited semiconductor film is an amorphous silicon film.

9. The method of manufacturing a semiconductor device as set forth in claim 8, further comprising the step of:

forming a polysilicon film by crystallizing said amorphous silicon film.

10. The method of manufacturing a semiconductor device as set forth in claim 1, wherein:

said deposited semiconductor film is a polysilicon film.

11. A method of manufacturing a semiconductor device provided with a thin film transistor including a light-shielding film composed of a metallic film formed on an insulating substrate and a semiconductor film formed on the light-shielding film via an insulating film, and a pixel electrode connected to said thin film transistor, comprising the steps of:

depositing said metallic film on said insulating substrate;

forming a first metallic oxide film by oxidizing a surface layer of said metallic film only to a predetermined thickness;

depositing said semiconductor film on said first metallic oxide film formed by the oxidizing process;

patterning said first metallic oxide film and said semiconductor film in a predetermined shape; and forming a second metallic oxide film by oxidizing an exposed region of said metallic film using the patterned first metallic oxide film and said semiconductor film as a mask.

12. The method of manufacturing a semiconductor device as set forth in claim 11, wherein:

said metallic film is made of at least one high melting-point metal selected from the group consisting of Ta, Ti, Mo and W.

13. The method of manufacturing a semiconductor device as set forth in claim 11, wherein:

said metallic film is composed of a metal which shows such a property that light is transmissible therethrough when oxidized.

14. The method of manufacturing a semiconductor device as set forth in claim 11, wherein:

said metallic film is composed of a metal which shows an insulating property when oxidized.

15. The method of manufacturing a semiconductor device as set forth in claim 11, wherein:

said step of patterning said semiconductor film and said insulating film is performed by a dry etching method.

16. The method of manufacturing a semiconductor device as set forth in claim 11, wherein:

said process of oxidizing the exposed region of said metallic film is performed by an anodic oxidization method.

17. The method of manufacturing a semiconductor device as set forth in claim 11, wherein:

said process of oxidizing the exposed region of said metallic film is performed by an annealing method in an atmosphere of oxygen.

18. The method of manufacturing a semiconductor device as set forth in claim 11, wherein:

said deposited semiconductor film is an amorphous silicon film.

19. The method of manufacturing a semiconductor device as set forth in claim 18, further comprising the step of:

forming a polysilicon film by crystallizing said amorphous silicon film.

20. The method of manufacturing a semiconductor device as set forth in claim 11, wherein:

said deposited semiconductor film is a polysilicon film.

* * * * *